US011696390B2

(12) United States Patent
Han et al.

(10) Patent No.: US 11,696,390 B2
(45) Date of Patent: Jul. 4, 2023

(54) SYSTEMS FOR SHIELDING BENT SIGNAL LINES

(71) Applicant: QUALCOMM Incorporated, San Diego, CA (US)

(72) Inventors: Jeahyeong Han, San Diego, CA (US); Suhyung Hwang, Rancho Mission Viejo, CA (US); Mina Iskander, San Diego, CA (US); Rajneesh Kumar, San Diego, CA (US); Darryl Sheldon Jessie, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 243 days.

(21) Appl. No.: 17/100,121

(22) Filed: Nov. 20, 2020

(65) Prior Publication Data

US 2021/0410274 A1    Dec. 30, 2021

Related U.S. Application Data

(60) Provisional application No. 63/043,265, filed on Jun. 24, 2020.

(51) Int. Cl.
| | | |
|---|---|---|
| *H01Q 1/22* | (2006.01) | |
| *H01Q 1/52* | (2006.01) | |
| *H01Q 21/29* | (2006.01) | |
| *H01Q 23/00* | (2006.01) | |
| *H05K 1/02* | (2006.01) | |
| *H01Q 1/48* | (2006.01) | |
| *H01Q 21/06* | (2006.01) | |
| *H05K 1/18* | (2006.01) | |

(52) U.S. Cl.
CPC ......... *H05K 1/0219* (2013.01); *H01Q 1/2283* (2013.01); *H01Q 1/48* (2013.01);
(Continued)

(58) Field of Classification Search
CPC ...... H01Q 1/2283; H01Q 1/526; H01Q 23/00; H01Q 21/06; H01Q 21/061; H01Q 21/29
See application file for complete search history.

(56) References Cited

U.S. PATENT DOCUMENTS 5,633,479 A * 5/1997 Hirano ............... H05K 1/0253
174/262
10,736,208 B2 * 8/2020 Takano ............... H05K 1/0393
(Continued)

FOREIGN PATENT DOCUMENTS

TW    201038149 A    10/2010

OTHER PUBLICATIONS

International Search Report and Written Opinion for International Patent Application No. PCT/US2021/033923, dated Aug. 10, 2021, 15 pages.

*Primary Examiner* — Jason Crawford
(74) *Attorney, Agent, or Firm* — W &T

(57) ABSTRACT

Systems for shielding bent signal lines provide ways to couple different antenna arrays for radio frequency (RF) integrated circuits (ICs) (RFICs) associated therewith where the antenna arrays are oriented in different directions. Because the antenna arrays are oriented in different directions, the antenna structures containing the antennas may be arranged in different planes, and signal lines extending therebetween may include a bend. To prevent electromagnetic interference (EMI) or electromagnetic crosstalk (EMC) from negatively impacting signals on the signal lines, the signal lines may be shielded. The shields may further include vias connecting the mesh ground planes and positioned exteriorly of the signal lines. The density of the vias may be varied to provide a desired rigidity in planes containing the antenna arrays while providing a desired flexibility at a desired bending location in the signal lines to help bending process accuracy.

29 Claims, 11 Drawing Sheets

(52) U.S. Cl.
CPC ........... *H01Q 1/526* (2013.01); *H01Q 21/061* (2013.01); *H05K 1/0225* (2013.01); *H05K 1/0227* (2013.01); *H05K 1/0278* (2013.01); *H01Q 21/29* (2013.01); *H01Q 23/00* (2013.01); *H05K 1/181* (2013.01); *H05K 2201/09609* (2013.01); *H05K 2201/09681* (2013.01); *H05K 2201/10098* (2013.01)

(56) References Cited

U.S. PATENT DOCUMENTS

| | | | |
|---|---|---|---|
| 2001/0010271 A1* | 8/2001 | Lin | H05K 9/0039 174/268 |
| 2008/0036668 A1* | 2/2008 | White | H01Q 1/38 343/873 |
| 2011/0075374 A1* | 3/2011 | Kang | H05K 3/4691 174/254 |
| 2014/0176266 A1 | 6/2014 | Kato et al. | |
| 2015/0116156 A1* | 4/2015 | Chen | H01Q 23/00 343/700 MS |
| 2015/0342030 A1* | 11/2015 | Watanabe | H05K 1/0225 174/268 |
| 2016/0020500 A1 | 1/2016 | Matsuda | |
| 2019/0103653 A1* | 4/2019 | Jeong | H01Q 1/2283 |
| 2019/0269009 A1* | 8/2019 | Park | H05K 1/028 |
| 2021/0376493 A1* | 12/2021 | Shah | H01Q 23/00 |
| 2021/0410274 A1* | 12/2021 | Han | H01Q 1/526 |

\* cited by examiner

SYSTEMS FOR SHIELDING BENT SIGNAL LINES

PRIORITY CLAIM

The present application claims priority to U.S. Provisional Patent Application Ser. No. 63/043,265, filed on Jun. 24, 2020 and entitled "SYSTEMS FOR SHIELDING BENT SIGNAL LINES," the contents of which is incorporated herein by reference in its entirety.

BACKGROUND

I. Field of the Disclosure

The technology of the disclosure relates generally to signal lines in a computing device and particularly to bent signal lines in a computing device.

II. Background

Computing devices abound in modern society. The abundance of such devices is attributable at least in part to the increased functionality and increased portability of modern computing devices. Whether the computing device is a smart phone, tablet, laptop, or the like, such mobile terminals rely on wireless connections to communicate to other devices which may be in remote locations. Most recently, fifth generation (5G) cellular networks have begun to be implemented. Such 5G networks, commonly referred to as 5G NR, may use one or more radio frequency (RF) transceivers, where the RF transceivers are integrated in RF integrated circuit (IC) (RFIC) transceiver chips in an RFIC package. These chips are mounted to a substrate support structure as part of the RFIC package. The support structure may include one or more metallization structures to provide chip-to-chip and external signal interfaces to the IC chips. The support structure may also include an antenna structure as part of a substrate to send and receive electrical signals that are radiated as electromagnetic (EM) signals. EM interference (EMI) shielding may also be present to prevent noise generated by the IC chips from causing de-sense or cross-talk issues within a mobile device. The advent of 5G and its new requirements provides an opportunity to improve on these packages.

SUMMARY OF THE DISCLOSURE

Aspects disclosed in the detailed description include systems for shielding bent signal lines. In particular, signal lines may be needed to couple different antenna arrays for radio frequency (RF) integrated circuits (ICs) (RFICs) associated therewith where the antenna arrays are oriented in different directions to provide better coverage that improves user experience under newer cellular standards. Because the antenna arrays are oriented in different directions, the antenna structures containing the antennas may be arranged in different planes, and signal lines extending therebetween may include a bend. To prevent electromagnetic interference (EMI) or electromagnetic crosstalk (EMC) from negatively impacting signals on the signal lines, the signal lines may be shielded. The shields may include a mesh ground plane above and below the signal lines to sandwich the signal lines therebetween. The shields may further include vias connecting the mesh ground planes where the vias are positioned exteriorly of the signal lines. The density of the vias may be varied to provide a desired rigidity in planes containing the antenna arrays while providing a desired flexibility at a desired bending location in the signal lines to help bending process accuracy. Such an arrangement allows easier positioning of the antenna arrays to provide better antenna coverage and concurrently shields the signal lines from EMI.

In this regard in one aspect, signal line structure for connecting two antenna-bearing substrates is disclosed. The signal line structure includes a first metal mesh layer. The signal line structure also includes a second metal mesh layer. The signal line structure also includes a plurality of vias each coupling the first metal mesh layer to the second metal mesh layer. The signal line structure also includes a signal layer including a plurality of signal lines. The signal layer is positioned between the first metal mesh layer and the second metal mesh layer.

In another aspect, a signal line structure for connecting two antenna-bearing substrates is disclosed. The signal line structure includes a first metal layer including a bottom mesh ground plane. The signal line structure also includes a first dielectric layer positioned on the first metal layer. The signal line structure also includes a second metal layer including a plurality of signal lines. The second metal layer is positioned on the first dielectric layer. The plurality of signal lines is configured to couple to the two antenna-bearing substrates. The signal line structure also includes a second dielectric layer positioned on the second metal layer. The signal line structure also includes a third metal layer including a top mesh ground plane. The third metal layer is positioned on the second dielectric layer. The signal line structure also includes a plurality of vias coupling the first metal layer to at least the second metal layer.

In another aspect, an antenna module is disclosed. The antenna module includes a passive rigid flex antenna structure. The passive rigid flex antenna structure includes a first portion. The first portion includes substrate antenna layers disposed in a first plane and including an antenna array including one or more antenna elements. The first portion also includes substrate metallization layers including one or more interconnect layers. The antenna module also includes a signal line structure. The signal line structure includes a first metal layer including a bottom mesh ground plane. The signal line structure also includes a first dielectric layer positioned on the first metal layer. The signal line structure also includes a second metal layer including a plurality of signal lines. The second metal layer is positioned on the first dielectric layer and the plurality of signal lines is coupled to at least a portion of the substrate metallization layers.

DETAILED DESCRIPTION

Figure 1A:
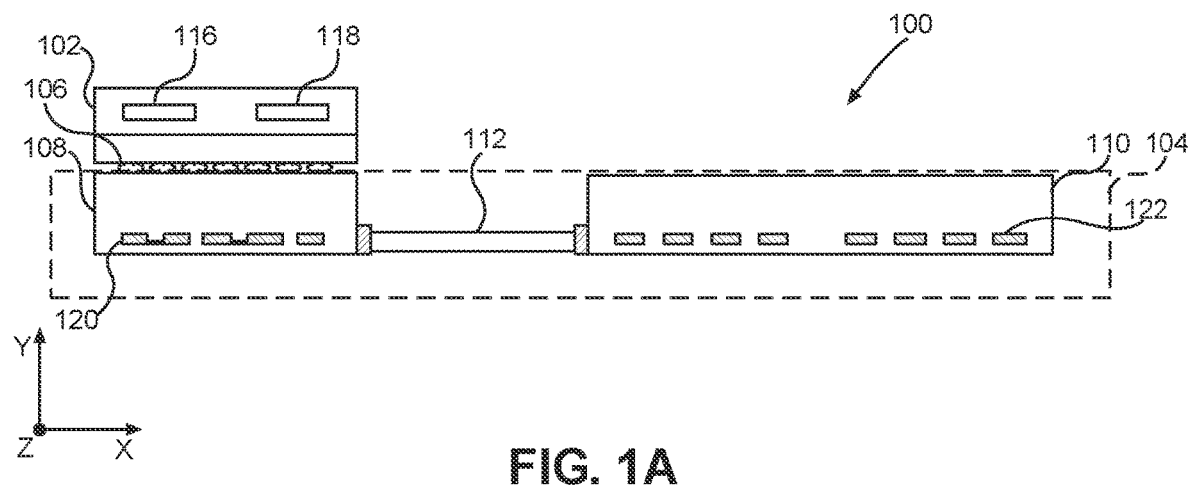
FIG. 1A is a side elevational cross-sectional view of an exemplary circuit package having two structures before assembly.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include systems for shielding bent signal lines. In particular, signal lines may be needed to couple different antenna arrays for radio frequency (RF) integrated circuits (ICs) (RFICs) associated therewith, where the antenna arrays are oriented in different directions to provide better coverage that improves user experience under newer cellular standards. Because the antenna arrays are oriented in different directions, the antenna structures containing the antennas may be arranged in different planes, and signal lines extending therebetween may include a bend. To prevent electromagnetic interference (EMI) or electromagnetic crosstalk (EMC) from negatively impacting signals on the signal lines, the signal lines may be shielded. The shields may include a mesh ground plane above and below the signal lines to sandwich the signal lines therebetween. The shields may further include vias connecting the mesh ground planes and where the vias are positioned exteriorly of the signal lines. The density of the vias may be varied to provide a desired rigidity in planes containing the antenna arrays while providing a desired flexibility at a desired bending location in the signal lines to help bending process accuracy. Such an arrangement allows easier positioning of the antenna arrays to provide better antenna coverage and concurrently shields the signal lines from EMI.

While the present disclosure is particularly well suited for use in a mobile terminal such as a smart phone, tablet, laptop, or the like, that wirelessly communicates with remote locations through a cellular protocol such as 5G, the present disclosure may be used in other computing devices.

An overview of a circuit package that may include the systems for shielding bent signal lines is provided in FIGS. 1A-2, with a discussion of the structure to shield the bent signal lines beginning below with reference to FIG. 3A.

Figure 1B:
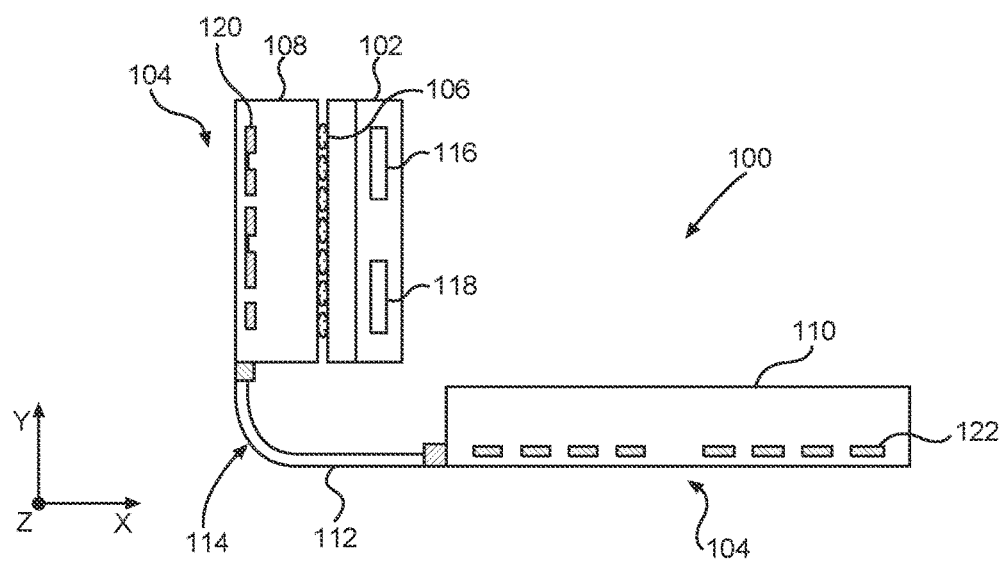
FIG. 1B is a side elevational cross-sectional view of the circuit package of FIG. 1A with bent signal lines according to an exemplary aspect of the present disclosure.

In this regard, FIG. 1A is a side elevational view of an antenna module (sometimes called a package) 100 prior to bending. The antenna module 100 includes an active module 102 that couples to a passive rigid flex antenna structure 104 through connectors such as a ball grid array (BGA) 106. The passive rigid flex antenna structure 104 may be formed of a first portion 108 and a second portion 110 joined by an intermediate portion 112 (sometimes referred to as a signal line structure for reasons explained below). During assembly, as shown in FIG. 1B, the antenna module 100 is assembled with a bend at a bending point 114 in the third or intermediate portion 112 such that the first portion 108 is parallel to a first plane along the y-axis and the second portion 110 is parallel to a second plane along the x-axis, and that the first and second planes are perpendicular to one another. A bent or bend portion is created proximate the bending point 114 and is defined herein to be approximately the portion of the intermediate portion 112 that is not in the first or second planes. Approximately as used herein is defined to be within five percent.

With continued reference to FIGS. 1A and 1B, the active module 102 may include a die, circuit elements such as transistors, inductors, capacitors, or the like to form functional elements such as an RFIC transceiver 116 or a power management IC (PMIC) 118. More detail on the active module 102 is provided below with reference to FIG. 2. The passive rigid flex antenna structure 104 may be formed through a single process to create a laminate structure, where the first portion 108 and the second portion 110 have, for example, five to seven layers including a substrate or metallization structure while the intermediate portion 112 has only, for example, three layers. The first portion 108 may include an antenna array 120 while the second portion 110 may include a second antenna array 122. The antenna arrays 120, 122 may be formed from a plurality of antenna elements as is well understood. After the bend is made at bending point 114, the antenna arrays 120, 122 lie in different planes, and are, for example, perpendicular to one another. The intermediate portion 112 may include signal lines that couple the antenna array 122 to metal structures in the first portion 108 to be electrically coupled to circuitry in the active module 102.

As noted above, FIG. 2 provides more detail about the active module 102 and the first portion 108. The active module 102 is disposed in a horizontal X-Z plane and includes encapsulated RF transceiver ICs 200. The active module 102 could include any ICs, such as RF transceiver ICs (e.g., RFIC transceiver 116) and thus may be considered an RFIC die, and/or PMICs 118. The active module 102 could also be just a PMIC. A bottom surface 202 of the active module 102 is mounted to substrate metallization layers 204 and particularly to an interconnect layer within the substrate metallization layers 204 as part of a substrate 206 also disposed in the horizontal X-Z plane to provide an electrical interface between the active module 102 and the substrate 206. The substrate 206 is a material that supports the formation of the substrate metallization layers 204. In this regard, an active surface 208 of the RF transceiver ICs 200 is electrically coupled the substrate metallization layers 204 also disposed in the horizontal X-Z plane to provide an electrical interface to the active module 102.

Figure 2:
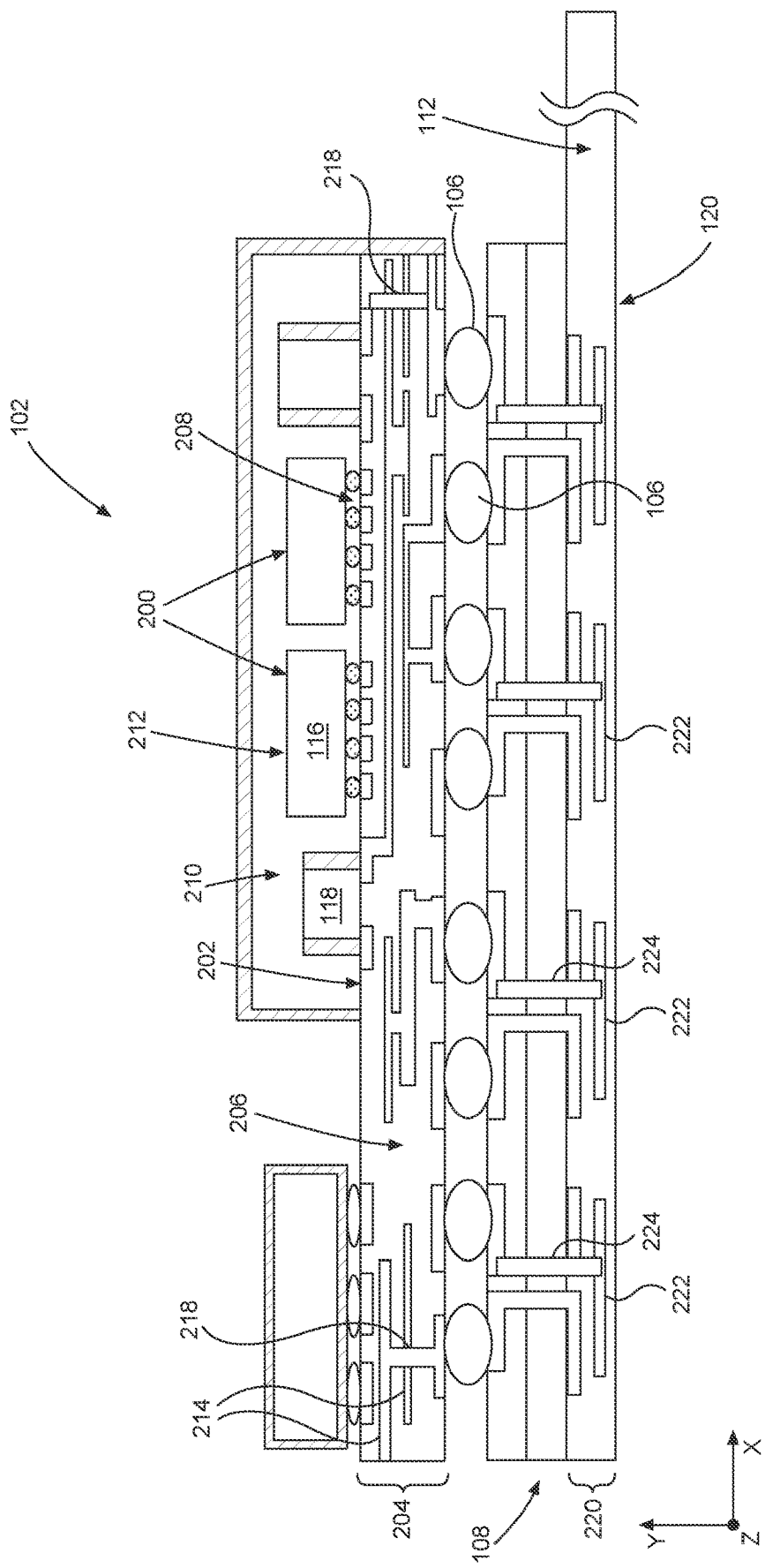
FIG. 2 is a side elevational cross-sectional view of a single structure having an antenna structure therein for attachment to a bent signal line.

With continuing reference to FIG. 2, a protective structure 210, such as a molding compound, is disposed on and above an inactive surface 212 of the RF transceiver ICs 200. As discussed in more detail below, the substrate 206 may be a package substrate or redistributed layers (RDLs) as examples. The substrate metallization layers 204 can include one or more interconnect layers 214 of electrical traces for signal routing and vertical interconnect accesses (vias) to couple electrical traces together between different interconnect layers. Die interconnects are mounted to and coupled to solder balls or the BGA 106 of the substrate metallization layers 204 to electrically couple the RF transceiver ICs 200 through the interconnect layers 214 in the substrate metallization layers 204 to the first portion 108. The substrate 206 includes conductive pillars 218, such as through-silica-vias (TSVs), to provide an electrical interface to the RF transceiver ICs 200.

With continuing reference to FIG. 2, the first portion 108 includes substrate antenna layers 220 disposed in the horizontal X-Z plane. The substrate antenna layers 220 include the antenna array 120 that includes one or more embedded antenna elements 222 to provide antennas for the RF transceiver ICs 200 in the active module 102. For example, the antenna elements 222 may be designed for wavelengths in 5G frequency bands. Multiple antenna elements 222 may be employed to provide signal transmission and reception capability, such as beamforming. The substrate antenna layers 220 also include conductive pillars 224 in this example that are electrically coupled to the conductive pillars 218 in the substrate 206. Note that the active module 102 of FIG. 2 is exemplary and other structures may be provided without departing from the scope of the present disclosure.

Figure 3A:
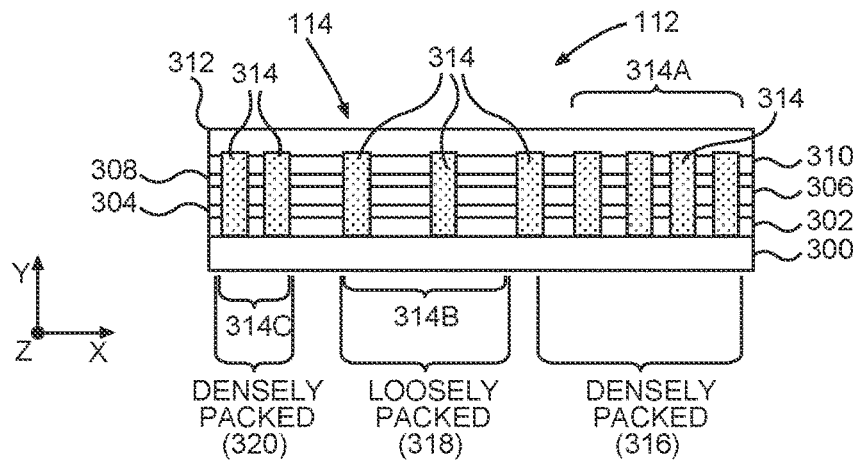
FIG. 3A is a side elevational cross-sectional view of a signal line structure that may connect structures having antennas before being bent.
Figure 3B:
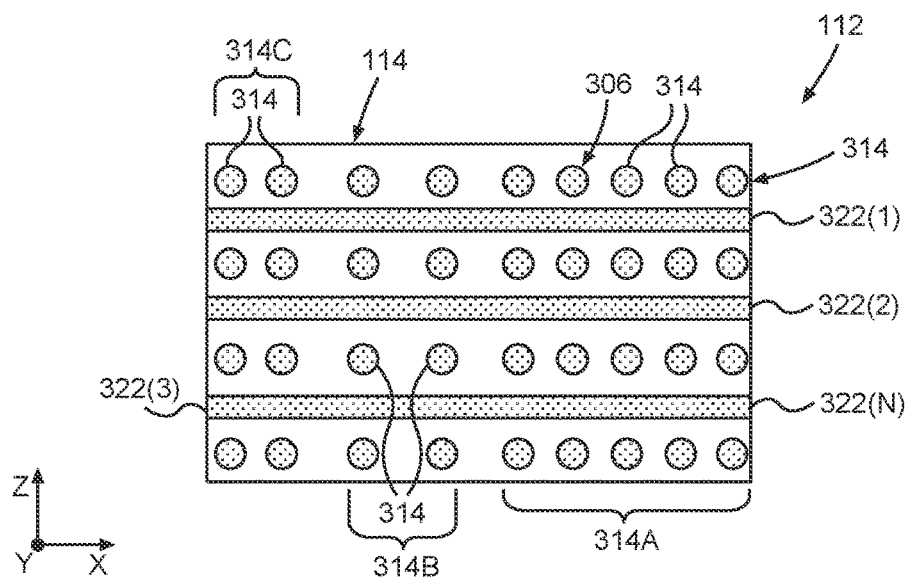
FIG. 3B is a top plan view of a layer of the structure of FIG. 3A having signal lines thereon.
Figure 3C:
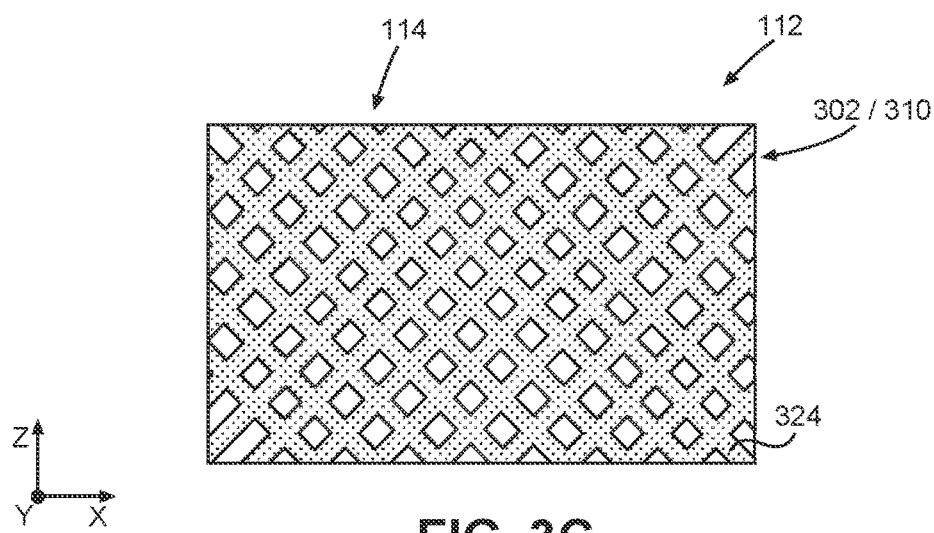
FIG. 3C is a top plan view of a layer of the structure of FIG. 3A with a ground plane thereon.

Of greater interest to the present disclosure is the intermediate portion 112 and bent signal lines therein as better illustrated in FIGS. 3A-3C. As noted above, the intermediate portion 112 may be a laminate structure. FIG. 3A provides a side elevational view of the intermediate portion 112 before the bend is made, although the bending point 114 is shown. The intermediate portion 112 includes a bottom dielectric layer 300 on which a first metal layer 302 is positioned. As used in this context, "positioned on" means positioned above along the Y axis. Where there is direct contact, the words "direct" or "directly" are used. The absence of the modifier "direct" contemplates both direct and indirect positioning (i.e., indirect positioning has some other layer interposed along the Y axis). A first dielectric layer 304 is positioned on the first metal layer 302. A second metal layer 306 is positioned on the first dielectric layer 304. A second dielectric layer 308 is positioned on the second metal layer 306. A third metal layer 310 is positioned on the second dielectric layer 308. A top dielectric layer 312 is positioned on the third metal layer 310. In an exemplary aspect, any one of the dielectric layers may be formed from a resin layer and a polyimide film (neither shown explicitly). The resin layer may be formed from an organic compound or polymer as is well understood. A plurality of vias 314 may extend from the first metal layer 302 to the third metal layer 310 and may electrically couple the first metal layer 302 to the third metal layer 310.

Exemplary aspects of the present disclosure facilitate the bend in the signal lines by varying the density with which the plurality of vias 314 is used. In a first portion 316 of the intermediate portion 112, a first set 314A of the plurality vias 314 is more densely spaced relative to a second set 314B of the plurality of vias 314 of a second portion 318 (the bent portion). Further, a third portion 320 may also have a third set 314C of the plurality of vias 314 that is more densely spaced. The variation in the density allows for the first and third portions 316 and 320 to have a desired rigidity and desired EMI shielding. The looser density of the second portion 318 allows for the bend to be made around the bending point 114 without crimping any vias 314.

Figure 5A:
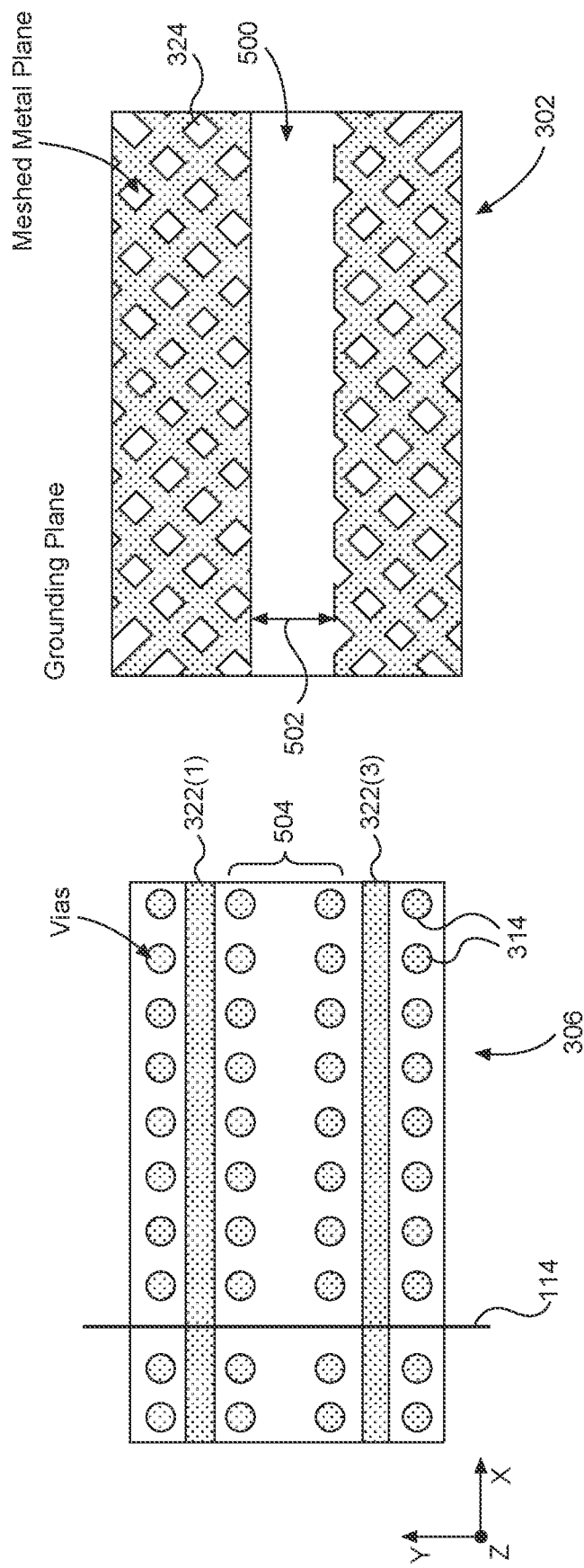
FIG. 5A is a top plan view of a signal line layer and a ground plane layer according to an alternate aspect of the present disclosure where a number of signal lines is varied allowing for the ground plane to be varied.

FIG. 3B illustrates the second metal layer 306 of the intermediate portion 112. In particular, signal lines 322(1)-322(N) may be provided along a longitudinal axis parallel to the X axis. As illustrated, N is three (3), but may be more (or fewer as illustrated in FIG. 5A). In general, however, there will be a plurality of signal lines 322(1)-322(N) (i.e., N is at least two generally). Further, vias 314 may be positioned between the signal lines 322(1)-322(N). Such positioning may help in providing desired rigidity as well as additional shielding. For example, the signal line 322(1) and the signal line 322(3) may carry signals while the signal line 322(2) may be a ground line or neutral line. By placing the vias 314 between the signal lines 322(1)-322(N), crosstalk may be reduced or eliminated while additional rigidity is supplied.

FIG. 3C illustrates the first metal layer 302 or the third metal layer 310. In an exemplary aspect, the first metal layer 302 and the third metal layer 310 have identical features, although such is not strictly required. As illustrated, the first metal layer 302 has a cross-hatched or diamond-shaped mesh pattern 324 made from a conductive metal forming a bottom mesh ground plane (note that the mesh in the third metal layer 310 would be a top mesh ground plane), which is less rigid than a full metal ground plane, but still provides enough coverage to shield against EMI. The mesh pattern 324 is coextensive (i.e., the same size within a tolerance of 5%) with the dielectric layers of the intermediate portion 112. The cross-hatch may be positioned to couple to the vias 314. In an exemplary aspect, the metal of the mesh pattern 324 covers more than fifty percent (50%) of the area of the intermediate portion 112. That is, metal is more abundant than the open spaces. However, as illustrated below, this arrangement is not critical. The amount of metal may be dictated by how much shielding is needed. Further, the mesh pattern 324 may assist in the adhesion to the dielectric layers.

Figure 4:
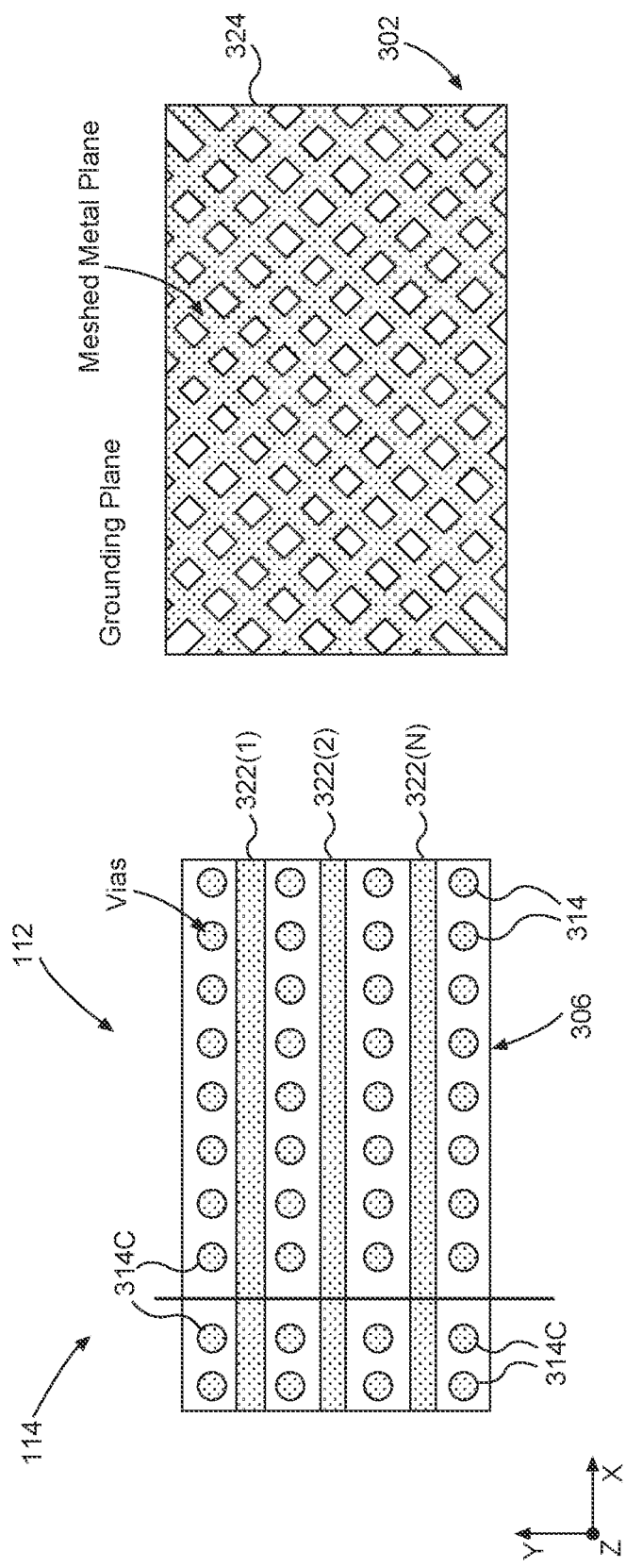
FIG. 4 is a top plan view of the layers illustrated in FIGS. 3B and 3C with an alternate via configuration to assist in bending.

Note that variations on the intermediate portion 112 are within the scope of the present disclosure. FIG. 4 shows the original intermediate portion 112 with a full mesh pattern 324 that is, as noted, coextensive with the dielectric layers 300, 304, 308, and 312 of the intermediate portion 112. While the bending point 114 is shown as a line proximate the left most edge on the longitudinal axis (i.e., the X axis), it should be appreciated that the bending point 114 may be moved along the longitudinal axis as needed based on the relative geometries and placement of the first and second portions 108, 110. Further note that while the intermediate portion 112 shown in FIGS. 3A-3C and 4 is rectilinear, the present disclosure is not so limited as better seen in FIG. 6A, discussed below.

As noted above, and better illustrated in FIG. 5A, the number of signal lines 322(1)-322(N) may be varied and the mesh pattern 324 may be non-continuous. Specifically, as illustrated, one of the signal lines 322(1)-322(N) such as signal line 322(2) may be omitted leaving just signal lines 322(1) and 322(3). The absence of a signal line 322(1)-322(N) may reduce emissions on the signal lines 322(1)-322(N) and change the amount of ground plane shielding provided by the mesh pattern 324. Thus, the mesh pattern 324 may delimit a non-meshed lane 500 that parallels the missing or omitted signal line 322(2). The lateral width 502 (i.e., in the Y-axis direction) may correspond to a gap 504 in the vias 314 so that remaining vias 314 may still couple to the mesh pattern 324. It should be appreciated that while only two signal lines 322(1), 322(3) are shown in FIG. 5A, there may be more signal lines and still have a gap or space therebetween as if a signal line 322(1)-322(N) was omitted (e.g., signal lines arranged as if there were five signal lines, but only four are present such as by omission of the central line). Further, more than one line may be omitted. Still another variation would be changing the placement of the omitted line from the center (e.g., one of the edge lines could be omitted).

Figure 5B:
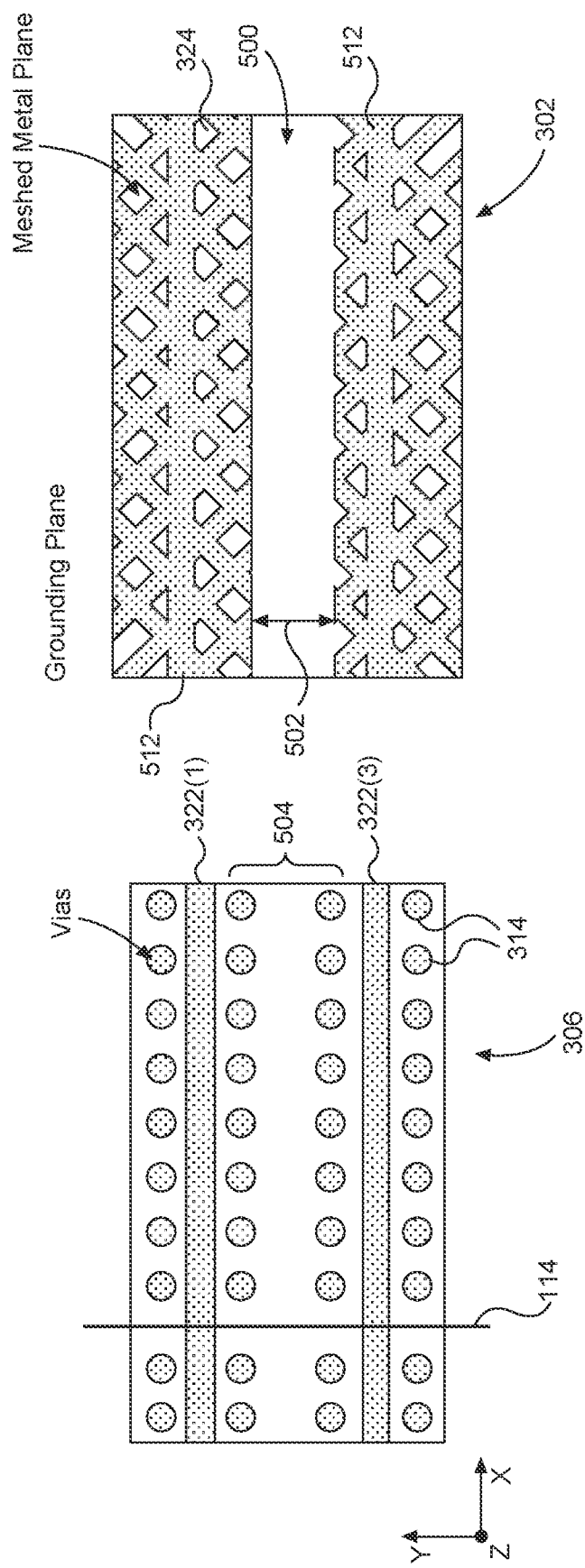
FIG. 5B is a top plan view of a signal line layer and a ground plane layer according to an alternate aspect where the ground plane covers the signal lines.

As a variation on this and other aspects, the ground plane may be modified to cover only the signal lines as better seen in FIG. 5B. In particular, the ground plane may be modified to be a strip 512 that is parallel to and covers the signal lines 322. While as illustrated, only signal line 322(3) is covered by the strip 512, it should be appreciated that the mesh pattern 324 may be completely replaced and signal line 322(1) may likewise be covered by just a strip. Use of strips in this manner may be appropriate for high-frequency operation.

Figure 6A:
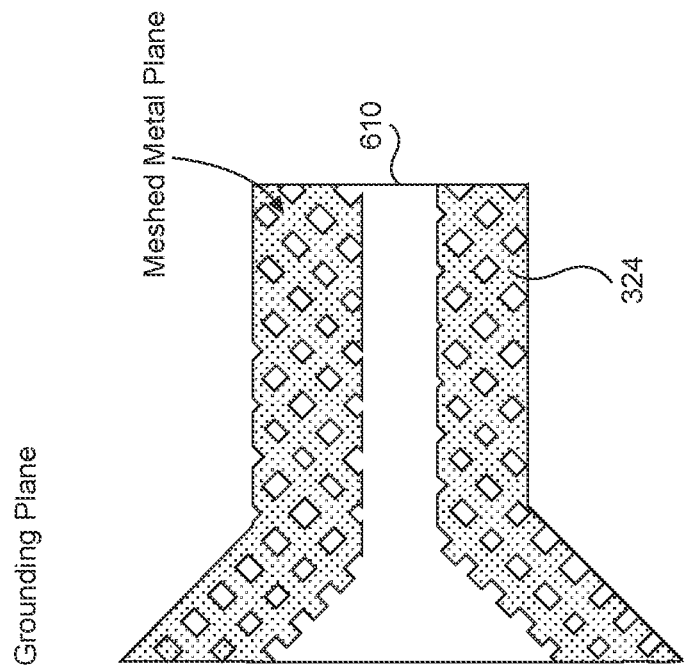
FIG. 6A is a top plan view of a signal line layer and a ground plane layer according to an alternate aspect of the present disclosure where the signal lines are bent in two dimensions.
Figure 6A:
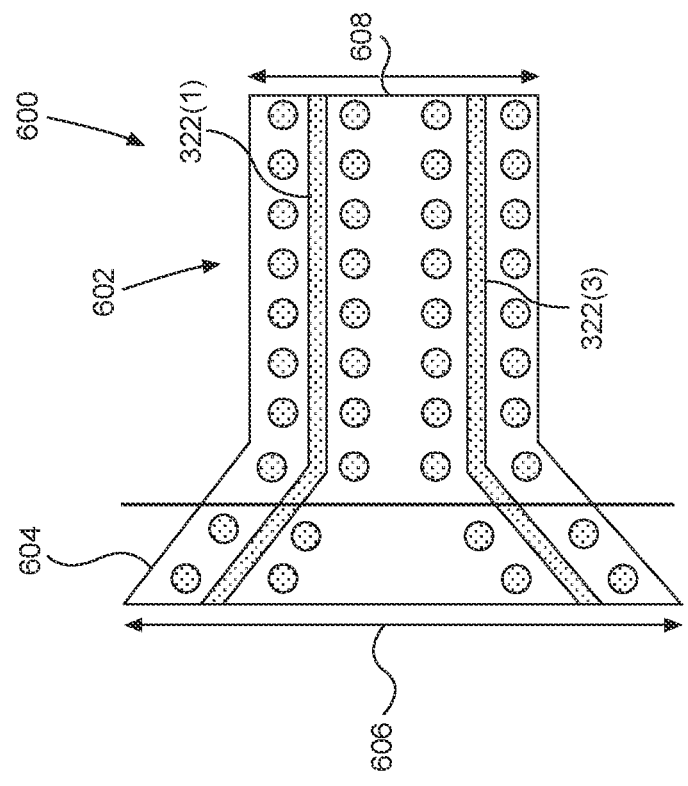

As noted above, and better illustrated in FIG. 6A, the intermediate portion 112 is not required to be rectilinear. So, as illustrated in FIG. 6A, a laminate structure 600 may include a first portion 602 which is rectilinear and a second portion 604 which is trapezoidal having a wider lateral edge 606 than the lateral edge 608 of the first portion 602. While only two signal lines 322(1) and 322(3) are shown, it should be appreciated that the number of signal lines 322(1)-322(N) may be varied as discussed above. Likewise, while the mesh pattern 324 is shown as discontinuous with gap 610, the mesh pattern 324 may be continuous for this non-rectilinear aspect. That is, many of the various aspects described herein are not mutually exclusive and may be mixed and matched to meet design needs. The change in dimension between the lateral edges 606 and 608 may be a function of respective size and contact placement for the active module 102 and/or any structures associated with the second portion 110. That is, for example, the second portion 110 may be relatively narrow and have contacts coupling to the laminate structure 600 that are relatively close together (e.g., on the order of magnitude of the lateral edge 608). In contrast, the active module 102 may be larger, allowing the first portion 108 to be larger and have contacts that are spaced further apart (e.g., on the order of magnitude of the lateral edge 606). Still other reasons for changing geometry may exist.

Figure 6B:
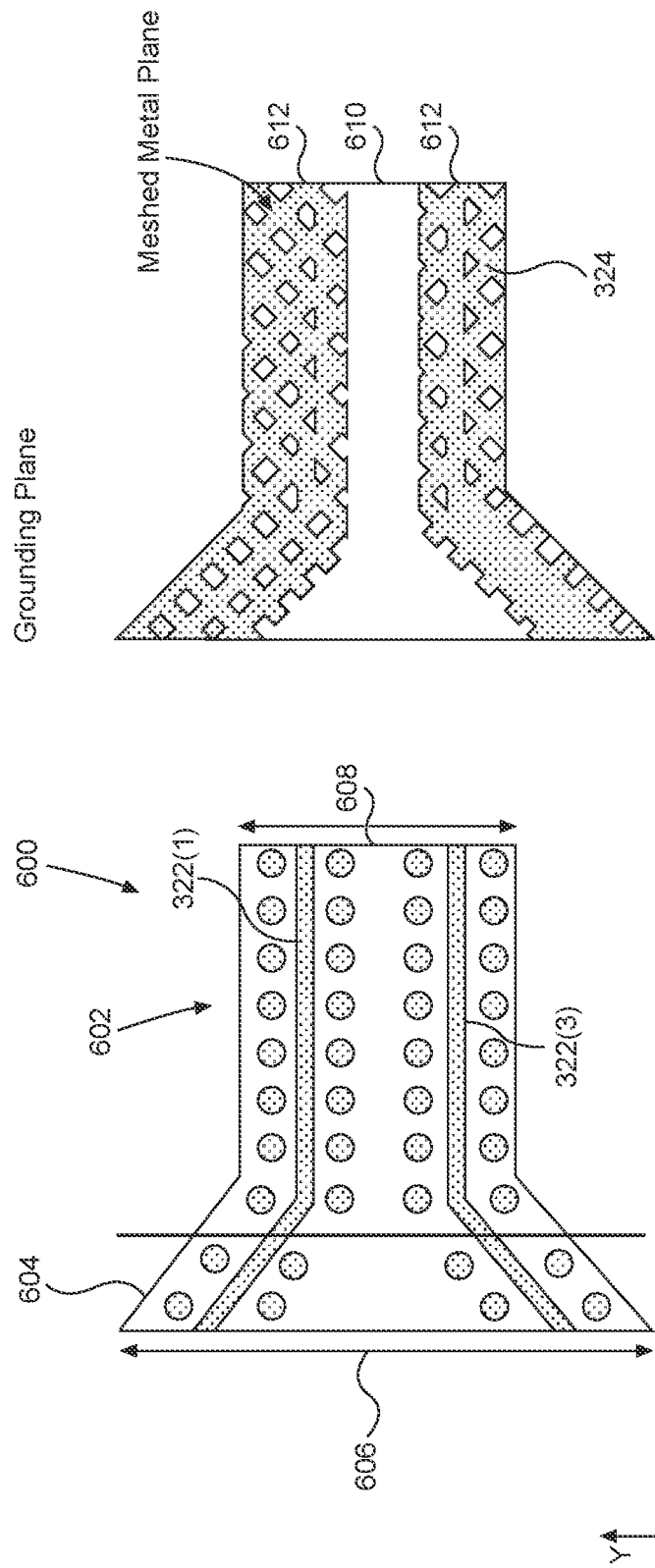
FIG. 6B is a top plan view of a signal line layer and a ground plane layer according to an alternate aspect where the ground plane covers the signal lines.

As with FIG. 5B, strips may be used for the different geometries of FIG. 6A. In particular, as illustrated in FIG. 6B, the ground plane may be modified to be a strip 612 that is parallel to and covers the signal lines 322. While as illustrated, only signal line 322(3) is covered by the strip 612, it should be appreciated that the mesh pattern may be completely replaced and signal line 322(1) may likewise be covered by just a strip. Use of strips in this manner may be appropriate for high-frequency operation.

Figure 7:
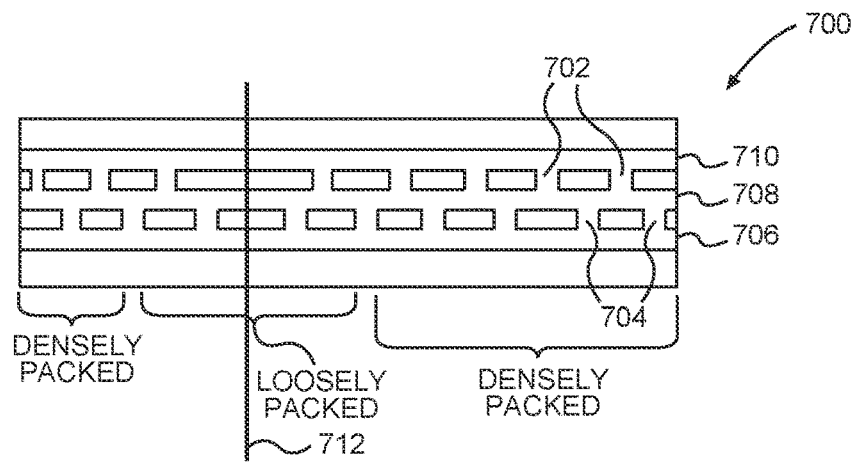
FIG. 7 is a side elevational view of a signal line structure with staggered vias between layers according to an aspect of the present disclosure.

While the vias 314 of FIG. 3A are shown as extending from the first metal layer 302 to the third metal layer 310, the present disclosure is not so limited. For example, as shown in FIG. 7, a laminate structure 700 may include first vias 702 that are staggered relative to second vias 704. That is, the second vias 704 only extend from a first metal layer 706 to a second metal layer 708, and the first vias 702 only extend from the second metal layer 708 to a third metal layer 710. As before, the first and third metal layers 706, 710 may include a ground plane mesh (not shown) while the second metal layer 708 may include signal lines (not shown). The density of the vias 702 and 704 may also be varied to accommodate a bending point 712 in keeping with aspects of the present disclosure already described. It should be appreciated that the vias 702 and 704 will still be positioned on either side of any signal lines present in the second metal layer 708 to effectuate desired shielding. Note that it is also possible to have some vias staggered as illustrated mixed with some vias that extend from the first metal layer 706 to the third metal layer 710 (not shown).

Figure 8:
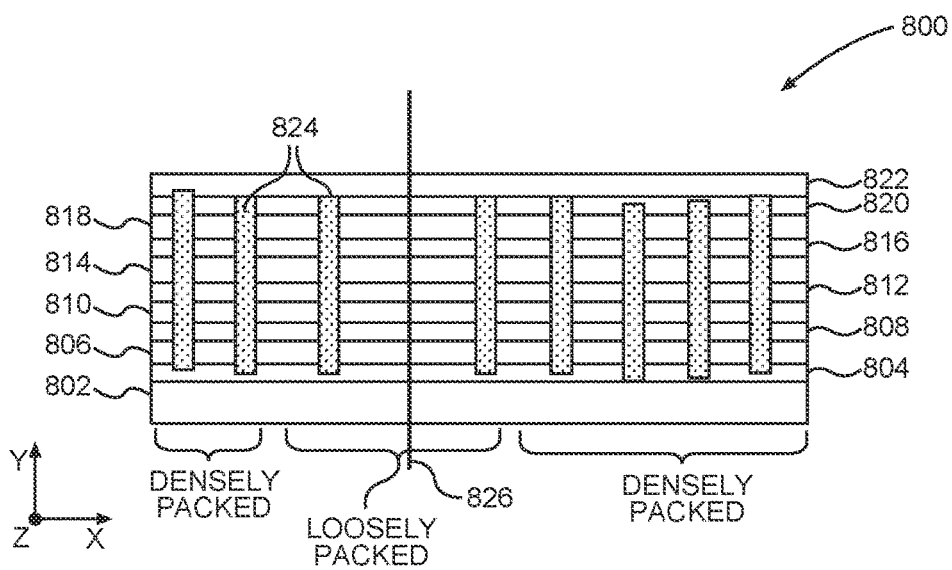
FIG. 8 is a side elevational view of a signal line structure with multiple layers containing signal lines according to an aspect of the present disclosure.

As noted above, there may be more than three metal layers. Thus, as illustrated in FIG. 8, a laminate structure 800 may include a bottom dielectric layer 802 with a first metal layer 804 positioned on the bottom dielectric layer 802. A first dielectric layer 806 may be positioned on the first metal layer 804. A second metal layer 808 may be positioned on the first dielectric layer 806. A second dielectric layer 810 may be positioned on the second metal layer 808. A third metal layer 812 may be positioned on the second dielectric layer 810. A third dielectric layer 814 may be positioned on the third metal layer 812. A fourth metal layer 816 may be positioned on the third dielectric layer 814. A fourth dielectric layer 818 may be positioned on the fourth metal layer 816. A fifth metal layer 820 may be positioned on the fourth dielectric layer 818, and a top dielectric layer 822 may be positioned on the fifth metal layer 820. Vias 824 may extend from the first metal layer 804 to the fifth metal layer 820. As before, the density of the vias 824 may be varied with less dense vias positioned proximate a bending point 826. In an exemplary aspect, any metal layers that include signal lines are sandwiched between metal layers containing ground planes. Thus, as illustrated, the second and fourth metal layers 808 and 816 may contain signal lines (not shown) while the first, third, and fifth metal layers 804, 812, and 820 may contain mesh ground planes (not shown).

Figure 9:
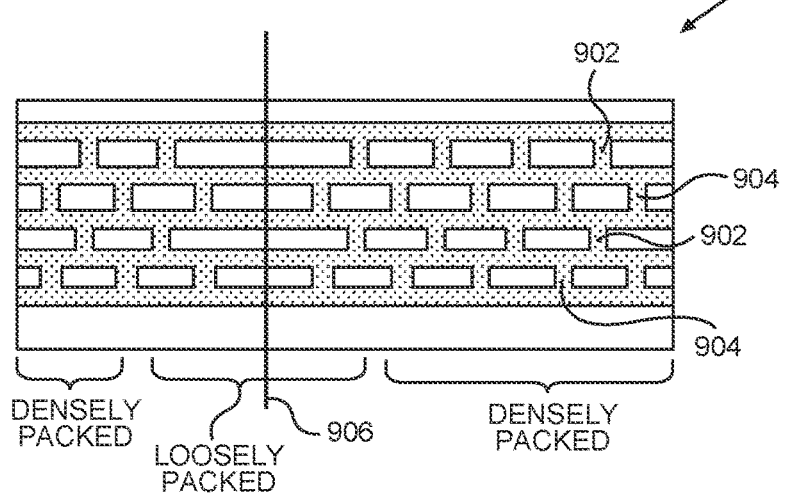
FIG. 9 is a side elevational view of a signal line structure like FIG. 8, but with staggered vias between layers according to an aspect of the present disclosure.

As noted above, aspects of the present disclosure may be mixed and matched as needed by other design considerations. Thus, for example, a laminate structure 900 illustrated in FIG. 9 may have staggered vias 902, 904. As with the staggered vias 702, 704 of FIG. 7, the density of the vias 902, 904 may be varied based on a bending point 906.

The systems for shielding bent signal lines according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 10:
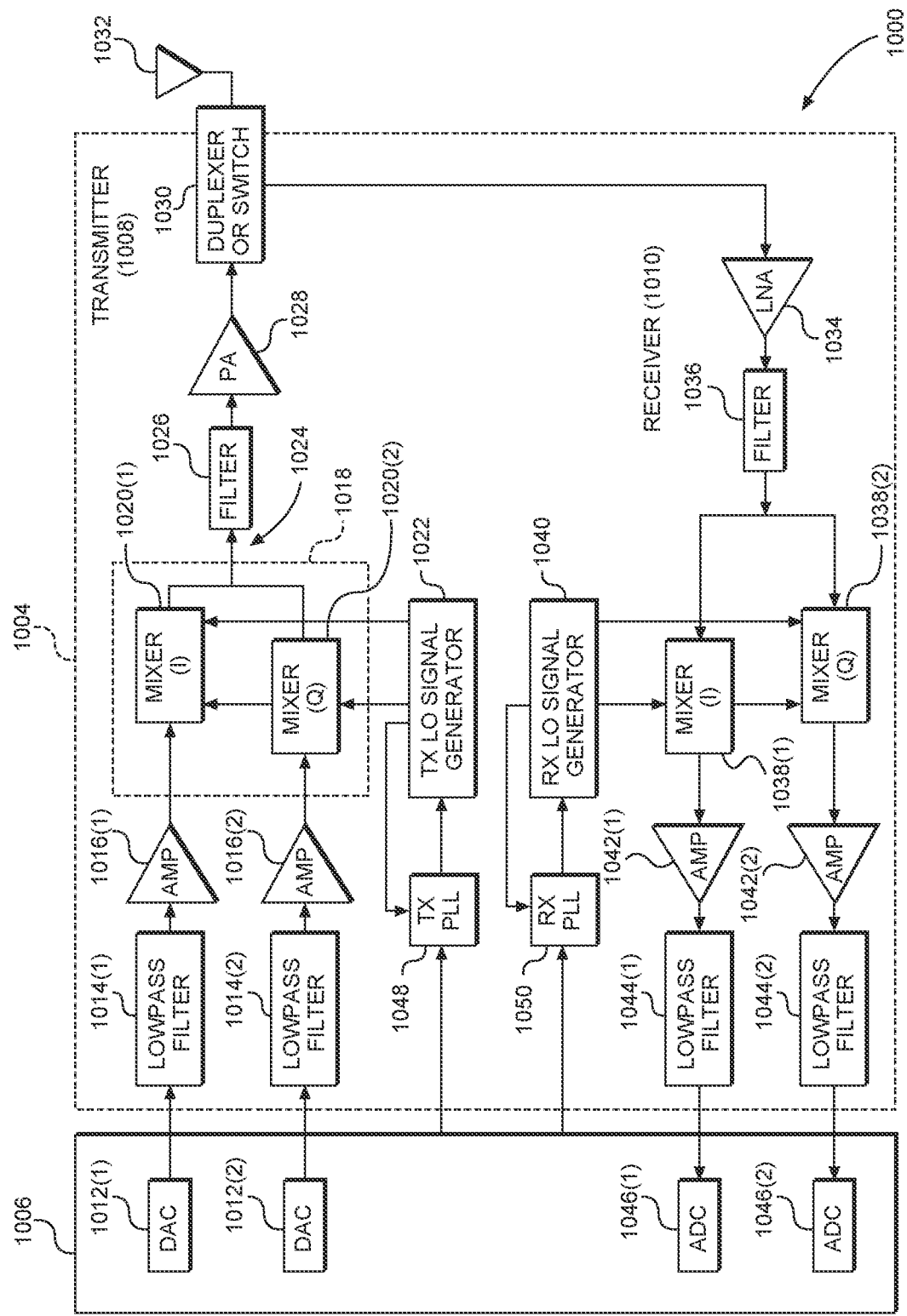
FIG. 10 is a block diagram of a wireless transceiver that can include the bent signal line structures of FIGS. 3A-9.

FIG. 10 illustrates an example of a wireless communications device 1000 which can include the antenna module 100 and its permutations. The wireless communications device 1000 may include or be provided in any of the above-referenced devices, as examples. As shown in FIG. 10, the wireless communications device 1000 includes a transceiver 1004 and a data processor 1006. The data processor 1006 may include a memory (not shown) to store data and program codes. The transceiver 1004 includes a transmitter 1008 and a receiver 1010 that support bi-directional communication. In general, the wireless communications device 1000 may include any number of transmitters and/or receivers for any number of communication systems and frequency bands. All or a portion of the transceiver 1004 may be implemented on one or more analog ICs, RFICs, mixed-signal ICs, etc.

A transmitter 1008 or a receiver 1010 may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for a receiver 1010. In the direct-conversion architecture, a signal is frequency converted between RF and baseband in one stage. The super-heterodyne and direct-conversion architectures may use different circuit blocks and/or have different requirements. In the wireless communications device 1000 in FIG. 10, the transmitter 1008 and the receiver 1010 are implemented with the direct-conversion architecture.

In the transmit path, the data processor 1006 processes data to be transmitted and provides I and Q analog output signals to the transmitter 1008. In the exemplary wireless communications device 1000, the data processor 1006 includes digital-to-analog-converters (DACs) 1012(1) and 1012(2) for converting digital signals generated by the data processor 1006 into the I and Q analog output signals, e.g., I and Q output currents, for further processing.

Within the transmitter 1008, lowpass filters 1014(1), 1014(2) filter the I and Q analog output signals, respectively, to remove undesired images caused by the prior digital-to-analog conversion. Amplifiers (AMPs) 1016(1), 1016(2) amplify the signals from the lowpass filters 1014(1), 1014(2), respectively, and provide I and Q baseband signals. An upconverter 1018 upconverts the I and Q baseband signals with I and Q transmit (TX) local oscillator (LO) signals through mixers 1020(1), 1020(2) from a TX LO signal generator 1022 to provide an upconverted signal 1024. A filter 1026 filters the upconverted signal 1024 to remove undesired images caused by the frequency upconversion as well as noise in a receive frequency band. A power amplifier (PA) 1028 amplifies the upconverted signal 1024 from the filter 1026 to obtain the desired output power level and provides a transmit RF signal. The transmit RF signal is routed through a duplexer or switch 1030 and transmitted via an antenna 1032.

In the receive path, the antenna 1032 receives signals transmitted by base stations and provides a received RF signal, which is routed through the duplexer or switch 1030 and provided to a low noise amplifier (LNA) 1034. The duplexer or switch 1030 is designed to operate with a specific RX-to-TX duplexer frequency separation, such that RX signals are isolated from TX signals. The received RF signal is amplified by the LNA 1034 and filtered by a filter 1036 to obtain a desired RF input signal. Downconversion mixers 1038(1), 1038(2) mix an output of the filter 1036 with I and Q receive (RX) LO signals (i.e., LO_I and LO_Q) from an RX LO signal generator 1040 to generate I and Q baseband signals. The I and Q baseband signals are amplified by AMPs 1042(1), 1042(2) and further filtered by lowpass filters 1044(1), 1044(2) to obtain I and Q analog input signals, which are provided to the data processor 1006. In this example, the data processor 1006 includes analog-to-digital-converters (ADCs) 1046(1), 1046(2) for converting the analog input signals into digital signals to be further processed by the data processor 1006.

In the wireless communications device 1000 in FIG. 10, the TX LO signal generator 1022 generates the I and Q TX LO signals used for frequency upconversion, while the RX LO signal generator 1040 generates the I and Q RX LO signals used for frequency downconversion. Each LO signal is a periodic signal with a particular fundamental frequency. A transmit (TX) phase-locked loop (PLL) circuit 1048 receives timing information from data processor 1006 and generates a control signal used to adjust the frequency and/or phase of the TX LO signals from the TX LO signal generator 1022. Similarly, a receive (RX) phase-locked loop (PLL) circuit 1050 receives timing information from the data processor 1006 and generates a control signal used to adjust the frequency and/or phase of the RX LO signals from the RX LO signal generator 1040.

Figure 11:
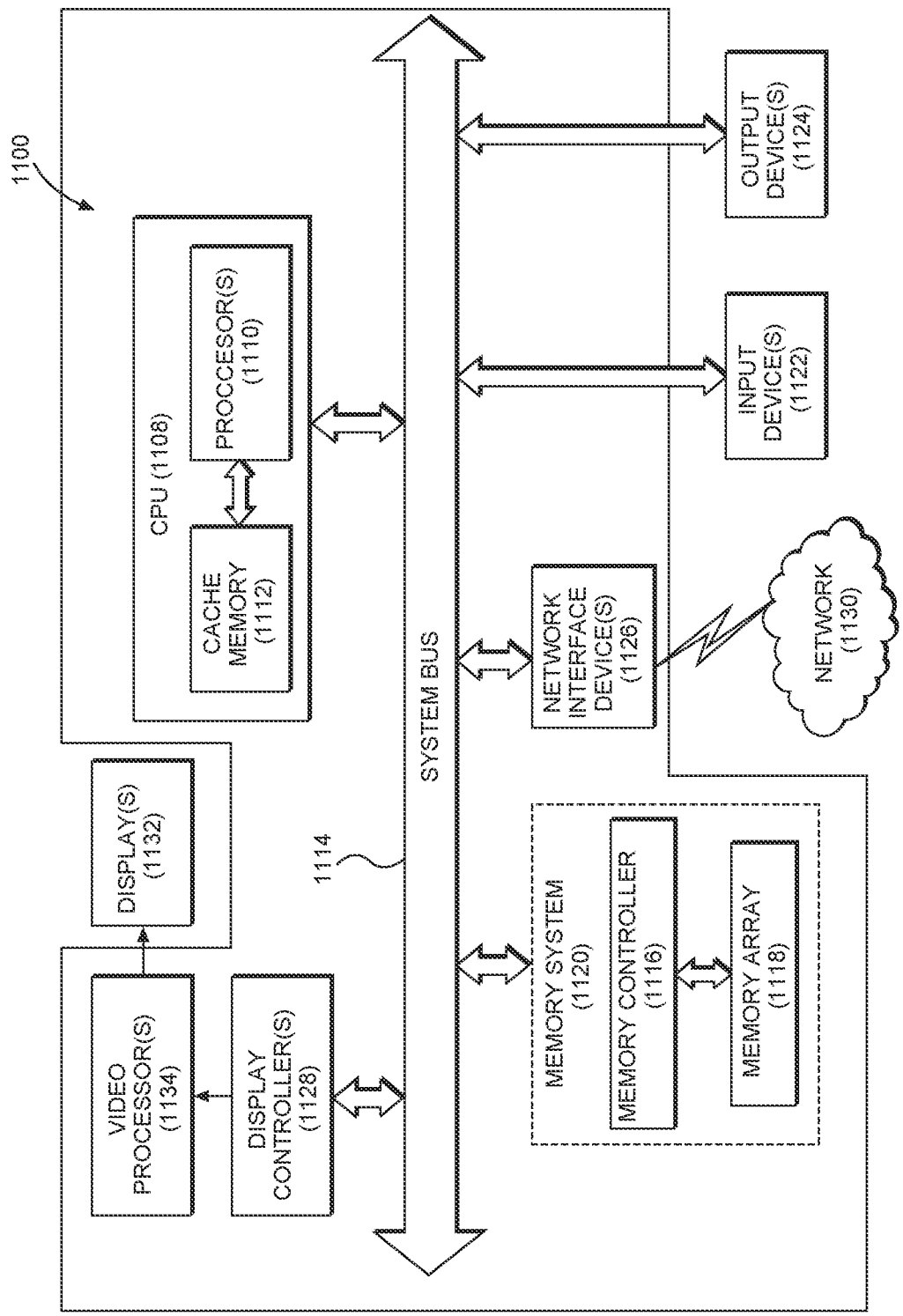
FIG. 11 is a block diagram of an exemplary processor-based system that can include the bent signal line structures of FIGS. 3A-9.

In this regard, FIG. 11 illustrates an example of a processor-based system 1100 that can employ the antenna module 100 illustrated in FIGS. 1A and 1B including its permutations illustrated in subsequent figures. In this example, the processor-based system 1100 includes one or more central processing units (CPUs) 1108, each including one or more processors 1110. The CPU(s) 1108 may have cache memory 1112 coupled to the processor(s) 1110 for rapid access to temporarily stored data. The CPU(s) 1108 is coupled to a system bus 1114 and can intercouple master and slave devices included in the processor-based system 1100. As is well known, the CPU(s) 1108 communicates with these other devices by exchanging address, control, and data information over the system bus 1114. For example, the CPU(s) 1108 can communicate bus transaction requests to a memory controller 1116 as an example of a slave device. Although not illustrated in FIG. 11, multiple system buses 1114 could be provided.

Other devices can be connected to the system bus 1114. As illustrated in FIG. 11, these devices can include a memory system 1120, one or more input devices 1122, one or more output devices 1124, one or more network interface devices 1126, and one or more display controllers 1128, as examples. The input device(s) 1122 can include any type of input device, including, but not limited to, input keys, switches, voice processors, etc. The output device(s) 1124 can include any type of output device, including, but not limited to, audio, video, other visual indicators, etc. The network interface device(s) 1126 can be any devices configured to allow exchange of data to and from a network 1130, and may for example be wireless and include a package having antennas such as the antenna module 100. The network 1130 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1126 can be configured to support any type of communications protocol desired. The memory system 1120 can include a memory array 1118.

The CPU(s) 1108 may also be configured to access the display controller(s) 1128 over the system bus 1114 to control information sent to one or more displays 1132. The display controller(s) 1128 sends information to the display(s) 1132 to be displayed via one or more video processors 1134, which process the information to be displayed into a format suitable for the display(s) 1132. The display(s) 1132 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations. Thus, the disclosure is not intended to be limited to the examples and designs described herein, but is to be accorded the widest scope consistent with the principles and novel features disclosed herein.

Implementation examples are described in the following numbered aspects:

1. A signal line structure for connecting two antenna-bearing substrates, comprising:
   a first metal mesh layer;
   a second metal mesh layer;
   a plurality of vias each coupling the first metal mesh layer to the second metal mesh layer; and
   a signal layer comprising a plurality of signal lines, the signal layer positioned between the first metal mesh layer and the second metal mesh layer.

2. The signal line structure of aspect 1, further comprising a first dielectric layer positioned on the first metal mesh layer.

3. The signal line structure of aspect 1 or 2, wherein a mesh structure on the first metal mesh layer comprises a diamond-shaped mesh.

4. The signal line structure of any of the aspects 1 to 3, wherein the plurality of signal lines comprises three signal lines.

5. The signal line structure of any of the aspects 1 to 4, wherein the plurality of vias is positioned exteriorly of the plurality of signal lines.

6. The signal line structure of any of the aspects 1 to 5, wherein the plurality of signal lines comprises a first portion in a first plane and a second portion in a second plane perpendicular to the first plane, the first portion connected to the second portion by a bend portion.

7. The signal line structure of aspect 6, wherein vias in the bend portion are provided at a first density and vias in the second portion are provided at a second density greater than the first density.

8. A signal line structure for connecting two antenna-bearing substrates, comprising:
   a first metal layer comprising a bottom mesh ground plane;
   a first dielectric layer positioned on the first metal layer;
   a second metal layer comprising a plurality of signal lines, the second metal layer positioned on the first dielectric layer;
   a second dielectric layer positioned on the second metal layer;
   a third metal layer comprising a top mesh ground plane, the third metal layer positioned on the second dielectric layer; and a plurality of vias coupling the first metal layer to at least the second metal layer.

9. The signal line structure of aspect 8, further comprising a bottom dielectric layer positioned beneath the first metal layer.

10. The signal line structure of aspect 8 or 9, further comprising a top dielectric layer positioned on top of the third metal layer.

11. The signal line structure of any of the aspects 8 to 10, wherein the first dielectric layer comprises a polyimide film and a resin.

12. The signal line structure of aspect 11, wherein the resin comprises one of an organic compound or a polymer.

13. The signal line structure of any of the aspects 8 to 12, wherein the plurality of signal lines comprises a first portion in a first plane and a second portion in a second plane perpendicular to the first plane, the first portion connected to the second portion by a bend portion.

14. The signal line structure of aspect 13, wherein vias in the bend portion are provided at a first density and vias in the second portion are provided at a second density greater than the first density.

15. The signal line structure of any of the aspects 8 to 14, wherein at least one via extends from the first metal layer to the third metal layer.

16. The signal line structure of any of the aspects 8 to 14, wherein the plurality of vias comprises a first set of vias extending from the first metal layer to the second metal layer and a second set of vias extending from the second metal layer to the third metal layer, wherein the first set of vias is offset longitudinally relative to the second set of vias.

17. The signal line structure of any of the aspects 8 to 16, further comprising:
   a third dielectric layer positioned on the third metal layer; and
   a fourth metal layer comprising a second plurality of signal lines, the fourth metal layer positioned on the third dielectric layer.

18. The signal line structure of any of the aspects 8 to 17, wherein the plurality of signal lines comprises two signal lines.

19. The signal line structure of any of the aspects 8 to 17, wherein the plurality of signal lines comprises three signal lines.

20. The signal line structure of any of the aspects 8 to 19, wherein the top mesh ground plane covers at least fifty percent (50%) of the second dielectric layer.

21. The signal line structure of any of the aspects 8 to 19, wherein the top mesh ground plane covers approximately one hundred percent (100%) of the second dielectric layer.

22. The signal line structure of any of the aspects 8 to 21, wherein the signal line structure has a first portion and a second portion, wherein the second portion is wider than the first portion.

23. The signal line structure of any of the aspects 8 to 22, wherein the layers of the signal line structure form a laminate structure.

24. The signal line structure of any of the aspects 8 to 24 integrated into an integrated circuit (IC).

25. The signal line structure of any of the aspects 8 to 24 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

26. An antenna module comprising:
   a passive rigid flex antenna structure comprising:
      a first portion, comprising:
         substrate antenna layers disposed in a first plane and comprising an antenna array comprising one or more antenna elements; and
         substrate metallization layers including one or more interconnect layers; and
      a signal line structure comprising:
         a first metal layer comprising a bottom mesh ground plane;
         a first dielectric layer positioned on the first metal layer;
         a second metal layer comprising a plurality of signal lines, the second metal layer positioned on the first dielectric layer, the plurality of signal lines coupled to at least a portion of the substrate metallization layers;
         a second dielectric layer positioned on the second metal layer;
         a third metal layer comprising a top mesh ground plane, the third metal layer positioned on the second dielectric layer; and
         a plurality of vias coupling the first metal layer to at least the second metal layer; and
   an active module positioned on the first portion, the active module comprising:
      a radio frequency (RF) integrated circuit (IC) (RFIC) transceiver circuit coupled to at least a portion of the substrate metallization layers.

27. The antenna module of aspect 26, wherein the passive rigid flex antenna structure further comprises a second portion comprising second substrate antenna layers coupled to the plurality of signal lines.

28. The antenna module of aspect 27, wherein the plurality of signal lines comprises a first line portion in the first plane and a second line portion in a second plane perpendicular to the first plane, the first line portion connected to the second line portion by a bend portion.

29. The antenna module of aspect 28, wherein vias in the bend portion are provided at a first density and vias in the second line portion are provided at a second density greater than the first density.

30. The antenna module of any of the aspects 26 to 29, wherein at least one via extends from the first metal layer to the third metal layer.

31. The antenna module of any of the aspects 26 to 29, wherein the plurality of vias comprises a first set of vias extending from the first metal layer to the second metal layer and a second set of vias extending from the second metal layer to the third metal layer, wherein the first set of vias is offset longitudinally relative to the second set of vias.

32. The antenna module of any of the aspects 26 to 31 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

What is claimed is:

1. An antenna module comprising:
a passive rigid flex antenna structure comprising:
   a first portion, comprising:
      substrate antenna layers disposed in a first plane and comprising an antenna array comprising one or more antenna elements; and
      substrate metallization layers including one or more interconnect layers; and
   a signal line structure comprising:
      a first metal layer comprising a bottom mesh ground plane;
      a first dielectric layer positioned on the first metal layer;
      a second metal layer comprising a plurality of signal lines, the second metal layer positioned on the first dielectric layer, the plurality of signal lines coupled to at least a portion of the substrate metallization layers;
      a second dielectric layer positioned on the second metal layer;
      a third metal layer comprising a top mesh ground plane, the third metal layer positioned on the second dielectric layer; and
      a plurality of vias coupling the first metal layer to at least the second metal layer; and
an active module positioned on the first portion, the active module comprising:
a radio frequency (RF) integrated circuit (IC) (RFIC) transceiver circuit coupled to at least a portion of the substrate metallization layers.

2. The antenna module of claim 1, wherein the bottom mesh structure comprises a diamond-shaped mesh.

3. The antenna module of claim 2, wherein the plurality of signal lines comprises three signal lines.

4. The antenna module of claim 2 integrated into a device selected from the group consisting of: a settop box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

5. The antenna module of claim 1, wherein the plurality of signal lines comprises three signal lines.

6. The antenna module of claim 1, wherein the plurality of vias is positioned exteriorly of the plurality of signal lines.

7. The antenna module of claim 1, wherein the plurality of signal lines comprises a first portion in a first plane and a second portion in a second plane perpendicular to the first plane, the first portion connected to the second portion by a bend portion.

8. The antenna module of claim 7, wherein vias in the bend portion are provided at a first density and vias in the second portion are provided at a second density greater than the first density.

9. The antenna module of claim 1, further comprising a bottom dielectric layer positioned beneath the first metal layer.

10. The antenna module of claim 1, further comprising a top dielectric layer positioned on top of the third metal layer.

11. The antenna module of claim 1, wherein the first dielectric layer comprises a polyimide film and a resin.

12. The antenna module of claim 11, wherein the resin comprises one of an organic compound or a polymer.

13. The antenna module of claim 11, wherein the plurality of signal lines comprises a first portion in a first plane and a second portion in a second plane perpendicular to the first plane, the first portion connected to the second portion by a bend portion.

14. The antenna module of claim 13, wherein vias in the bend portion are provided at a first density and vias in the second portion are provided at a second density greater than the first density.

15. The antenna module of claim 11, wherein at least one via extends from the first metal layer to the third metal layer.

16. The antenna module of claim 11, wherein the plurality of vias comprises a first set of vias extending from the first metal layer to the second metal layer and a second set of vias extending from the second metal layer to the third metal layer, wherein the first set of vias is offset longitudinally relative to the second set of vias.

17. The antenna module of claim 1, further comprising:
a third dielectric layer positioned on the third metal layer; and
a fourth metal layer comprising a second plurality of signal lines, the fourth metal layer positioned on the third dielectric layer.

18. The antenna module of claim 1, wherein the plurality of signal lines comprises two signal lines.

19. The antenna module of claim 1, wherein the top mesh ground plane covers at least fifty percent (50%) of the second dielectric layer.

20. The antenna module of claim 1, wherein the top mesh ground plane covers approximately one hundred percent (100%) of the second dielectric layer.

21. The antenna module of claim 1, wherein the signal line structure has a first portion and a second portion, wherein the second portion is wider than the first portion.

22. The antenna module of claim 1, wherein the layers of the signal line structure form a laminate structure.

23. The antenna module of claim 1, integrated into an integrated circuit (IC).

24. The antenna module of claim 1, wherein the passive rigid flex antenna structure further comprises a second portion comprising second substrate antenna layers coupled to the plurality of signal lines.

25. The antenna module of claim 24, wherein the plurality of signal lines comprises a first line portion in the first plane and a second line portion in a second plane perpendicular to the first plane, the first line portion connected to the second line portion by a bend portion.

26. The antenna module of claim 25, wherein vias in the bend portion are provided at a first density and vias in the second line portion are provided at a second density greater than the first density.

27. The antenna module of claim 1, wherein at least one via extends from the first metal layer to the third metal layer.

28. The antenna module of claim 1, wherein the plurality of vias comprises a first set of vias extending from the first metal layer to the second metal layer and a second set of vias extending from the second metal layer to the third metal layer, wherein the first set of vias is offset longitudinally relative to the second set of vias.

29. The antenna module of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

\* \* \* \* \*